US012768886B2

(12) United States Patent
Balasubramanium et al.

(10) Patent No.: US 12,768,886 B2
(45) Date of Patent: Oct. 20, 2026

(54) METHOD FOR ANALYZING A DEMODULATED MEASUREMENT SIGNAL, COMPUTER-READABLE STORAGE MEDIUM, AND TEST INSTRUMENT

(71) Applicant: Rohde & Schwarz GmbH & Co. KG, Munich (DE)

(72) Inventors: PB Balasubramanium, Munich (DE); Martin Schmaehling, Munich (DE); Annika Germer, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 445 days.

(21) Appl. No.: 18/345,504

(22) Filed: Jun. 30, 2023

(65) Prior Publication Data

US 2025/0004050 A1 Jan. 2, 2025

(51) Int. Cl.
*G01R 31/317* (2006.01)
*G01R 13/02* (2006.01)

(52) U.S. Cl.
CPC ... *G01R 31/31708* (2013.01); *G01R 13/0254* (2013.01)

(58) Field of Classification Search
CPC ........................ G01R 31/31708; G01R 31/317; G01R 31/28; G01R 31/00; G01R 13/0254; G01R 13/0218; G01R 13/02
See application file for complete search history.

(56) References Cited

U.S. PATENT DOCUMENTS

| | | | | |
|---|---|---|---|---|
| 9,291,646 | B2 * | 3/2016 | Dobyns | G01R 13/0254 |
| 2012/0041701 | A1 * | 2/2012 | Hillman, Jr. | G01R 13/0254 702/66 |
| 2012/0194169 | A1 * | 8/2012 | Smith | H03L 7/093 324/76.41 |
| 2017/0138992 | A1 * | 5/2017 | Bresser | G01R 23/165 |
| 2019/0277886 | A1 * | 9/2019 | Landolt | G01R 13/0272 |
| 2022/0335327 | A1 * | 10/2022 | Dierks | G06N 20/00 |

OTHER PUBLICATIONS

Tektronix, Spectrum Analyzer RSA6000 Series Datasheet, Dec. 20, 2011, Tektronix, pp. 1-48. (Year: 2011).*

* cited by examiner

*Primary Examiner* — Mohamed Charioui
(74) *Attorney, Agent, or Firm* — CHRISTENSEN O'CONNOR JOHNSON KINDNESS PLLC

(57) ABSTRACT

A method for analyzing a demodulated measurement signal is described. The method includes, for example, the following steps: obtaining a demodulated measurement signal; deriving a processed signal from the demodulated measurement signal; applying a trigger mask to the processed signal; and evaluating if the processed signal creates a trigger event with respect to the trigger mask.

19 Claims, 2 Drawing Sheets

METHOD FOR ANALYZING A DEMODULATED MEASUREMENT SIGNAL, COMPUTER-READABLE STORAGE MEDIUM, AND TEST INSTRUMENT

FIELD OF THE DISCLOSURE

The present disclosure relates to a method for analyzing a demodulated measurement signal. One aspect relates to a computer-readable storage medium comprising instructions for carrying out a method for analyzing a demodulated measurement signal. Another aspect relates to a test instrument, for example a vector signal analyzer.

BACKGROUND

In real-time signal analysis, the use of frequency mask triggers is known. A frequency mask trigger is triggered when a level in a frequency spectrum exceeds a value defined in the frequency mask. Hence, for example data acquisition can be triggered on occurrence of a particular event.

A frequency mask trigger allows for more customized trigger settings than a simple level trigger. However, a received signal may have properties that are not (at least not fully or directly) characterized by the frequency spectrum of the signal. Signal analysis methods relying on conventional frequency mask triggers therefore have limitations, for example regarding their adaptability to different applications or circumstances.

SUMMARY

The present disclosure provides examples of a method for analyzing a demodulated measurement signal. In an embodiment, the method comprises the steps of: obtaining a demodulated measurement signal; deriving a processed signal from the demodulated measurement signal; applying a trigger mask to the processed signal; and evaluating if the processed signal creates a trigger event with respect to the trigger mask.

In some embodiments, the demodulated measurement signal is derived from a (digitally) modulated signal. In some embodiments, the (digitally) modulated signal is a single-carrier signal. In some of these embodiments, the (digitally) modulated signal comprises a symbol sequence. Transmitted symbols may be recovered by demodulating the signal.

Generally, a trigger event may be created when a trigger condition defined by the trigger mask is met. This may relate to violating the trigger mask or falling into the trigger mask. In the context of the present disclosure, a signal violating a trigger mask is particularly to be understood as the signal having a value lying outside an area defined by the trigger mask. Hence, a signal falling into the trigger mask is particularly to be understood as the signal having a value lying inside an area defined by the trigger mask. Both scenarios may apply which depend on the type of trigger applied.

By applying a trigger mask to a processed signal (as opposed to an unprocessed signal), the variety of detectable features or incidents and the reliability of detection can be enhanced. Further, use of the trigger mask can reduce a risk of missing infrequent events in the measured signal.

In some embodiments, the improved analysis is performed automatically, instead of having to rely on a manual review of already recorded measurement signals. Thus, measurements can be simplified and time can be saved.

According to one aspect, the trigger mask may be, for example, an at least two-dimensional mask that is applied to a diagram that illustrates the processed signal. The trigger mask particularly defines an area in the diagram that is displayed on a display, e.g. a display of a test instrument like a vector signal analyzer.

In some embodiments, the diagram can, for example. correspond to a phase error versus time or phase error as a function of symbols over time. An action can thus be triggered when the phase error has a value either outside or inside of an area defined by the trigger mask. In some embodiments, the phase error is the phase error of the demodulated measurement signal with respect to a reference signal.

In some embodiments, the diagram may also correspond to a frequency error versus time, for example a frequency error as a function of symbols over time. Thus, an action can be triggered when the frequency error has a value either outside or inside of an area defined by the trigger mask. The frequency error may be an error of the instantaneous frequency in Hz of the demodulated measurement signal with respect to a reference signal.

The frequency error may be an absolute frequency error. Alternatively, it may be a relative frequency error. In some embodiments, the relative frequency error is normalized, depending on the used modulation scheme, to the symbol rate, to the estimated frequency shift keying (FSK) deviation, or to one quarter of the symbol rate.

As another example, the diagram may correspond to a magnitude error versus time, for example a magnitude error as a function of symbols over time. An action can thus be triggered when the magnitude error has a value either outside or inside of an area defined by the trigger mask. In some embodiments, the magnitude error is a magnitude error of the demodulated measurement signal with respect to a reference signal. In some of these embodiments, the magnitude error is a difference of a magnitude of the demodulated measurement signal to the reference signal.

Alternatively, the diagram may be an eye diagram (eye pattern). An action can thus be triggered based on a repetitively sampled signal and hence on a comprehensive data set. The eye diagram may display the in-phase component or the quadrature component of the demodulated measurement signal. Further, the diagram may also be an eye diagram of the frequency of the demodulated measurement signal and/or a reference signal.

Generally, the trigger event may take place depending on the specific trigger applied such that the respective action is triggered either when the value is outside the area defined by the trigger mask or inside the area defined by the trigger mask, which depends on the type of trigger applied.

According to one aspect, the method may comprise, for example, determining a frequency response of an equalizer function by calculating an optimal error vector magnitude for the demodulated measurement signal with respect to a reference signal. Thus, a basis for obtaining additional information about the signal characteristics can be provided. In some embodiments, the optimal error vector magnitude is calculated by minimizing the mean square error vector magnitude. In some embodiments, the error vector magnitude is the magnitude of the error vector.

In some embodiments, the error vector is the difference between the measurement signal vector of the demodulated measurement signal and a reference signal vector of a reference signal. Generation of the reference signal may be based on the detected symbols from the demodulated measurement signal and the specifications of the signal model (i.e. modulation scheme, transmit filter, and transmitted symbols). In some embodiments, the reference signal represents an "ideal" signal.

Considering the equalizer function (and its frequency response) can provide an enhanced level of control over the detection of specific distortions. Known methods and instruments do not allow triggering an event according to specified parameters of an equalizer function. Hence, it has heretofore not been possible with known triggers e.g. to check specifically for a particular type of distortion. Checking for specific distortions (using the trigger function) provides valuable additional information about a signal and particularly about the system emitting the signal and/or about the signal path.

For example, signals emitted or reflected from a moving object, for example from a vehicle, may be analyzed and additional information about the object may be obtained. In some embodiments, a Doppler shift of a received signal and derived values like speed and acceleration of an observed object can be taken into account. These values may aide e.g. in analyzing orbital perturbations of a spacecraft and in analyzing why a satellite's orbit differs from an ideal orbit.

According to one aspect, the processed signal may be, for example, a frequency response magnitude (FRM). In some embodiments, the FRM is a magnitude of a frequency response of the equalizer function (i.e. in the frequency domain). An action can thus be triggered when the FRM has a value either outside or inside of an area defined by the trigger mask. Applying the trigger mask to the FRM allows triggering if the demodulated measurement signal includes a specific and/or particularly strong distortion. As explained above, the frequency response of the equalizer function depends on the error vector magnitude (EVM). The EVM is a comprehensive measure of potential errors and distortions of a measurement signal.

In some embodiments, the processed signal may be a channel frequency response magnitude. As compared to the FRM described above, compensation for distortions in the demodulated measurement signal is deactivated in this case. Thus, actual error values from the distorted channel can be obtained.

Further, the processed signal may be a frequency response phase of the equalizer function. In some embodiments, the frequency response phase is a phase of the frequency response of the equalizer function (i.e. in the frequency domain).

According to one aspect, the processed signal may be, for example, a frequency response group delay of the equalizer function. In some embodiments, the frequency response group delay is the derivation of phase over frequency. The frequency group delay is a measure of phase distortion. Accordingly, it can be enabled to trigger an action if a specific phase distortion occurs.

Moreover, the processed signal may be a channel frequency response group delay. It is likewise a measure of phase distortion. The channel frequency response group delay is particularly the derivation of phase over frequency for an original measurement signal, for example for a measurement signal where compensation for distortions is deactivated.

The processed signal may be an impulse response magnitude of the equalizer function, as a function of time. In some embodiments, the impulse response magnitude is the magnitude of the equalizer function in the time domain. Alternatively, the processed signal may be an impulse response phase of the equalizer function, as a function of time. In some embodiments, the impulse response phase is the phase of the equalizer coefficients in the time domain.

In some embodiments, the processed signal may be a phase error of the demodulated measurement signal with respect to a reference signal, as a function of time, for example as a function of symbols over time. Triggering in the event of a specific constellation in the phase error versus time plane can thus be enabled. In some embodiments, the phase error is determined by calculating a phase difference between the measurement vector (of the demodulated measurement signal) and the reference vector (of the reference signal).

Alternatively, the processed signal may be an error of the instantaneous frequency of the demodulated measurement signal with respect to a reference signal, as a function of time, for example as a function of symbols over time. Hence, triggering in the event of a specific constellation in the frequency error versus time plane can be enabled. The frequency error is particularly measured in the unit Hertz (Hz).

Moreover, the processed signal may be a magnitude error of the demodulated measurement signal with respect to a reference signal, as a function of time, for example as a function of symbols over time.

According to an aspect, the method comprises, for example, triggering a data acquisition when the processed signal creates the trigger event, e.g. violates the trigger mask. The data acquisition can thus be automatically triggered in the event that specific circumstances (e.g. distortions in the demodulated measurement signal) are detected. The data acquisition may include transferring signal data from a data buffer to a memory.

The method may further comprise storing measurement data from a predefined time window encompassing the trigger event. Thus, pre-trigger data as well as post-trigger data can be captured, namely data prior to the trigger event as well as data after the trigger event.

Moreover, the method may comprise tagging portions of a recorded demodulated signal corresponding to portions of the processed signal creating the trigger event, e.g. violating the mask. Hence, areas of interest of the processed signal (highlighted via the trigger mask) can also be highlighted in the stored data corresponding to the demodulated measurement signal.

According to one aspect, the trigger mask may be customizable. A user can thus define areas of interest of the processed signal, for example, of a diagram showing the processed signal. A high degree of adaptability to different circumstances and user preferences can thus be provided.

Generally, the trigger mask may be an at least two-dimensional mask. The number of dimensions of the trigger mask particularly corresponds to the number of dimensions of the processed signal.

In some embodiments, the trigger mask may be a three-dimensional mask. Triggering in the event of specific constellations in a three-dimensional space of variables can thus be enabled. One of the dimensions, for example the third dimension, may be time. The three-dimensional mask can be applied to a processed signal captured over time or to a processed signal captured repeatedly over time.

For a trigger mask having three or more dimensions, a processed signal creating the trigger event, e.g. violating the trigger mask, is to be understood as the signal lying either inside or outside (in case of violation) a volume defined by the trigger mask.

An equalizer function usable in methods according to the present disclosure may have three dimensions. In some embodiments, the third dimension is time. A diagram showing a corresponding equalizer function may have time on a third axis. A three-dimensional trigger mask as described above may be used for a processed signal related to an equalizer function having three dimensions.

The method may comprise using a section of a three-dimensional trigger mask as a two-dimensional trigger mask. In some embodiments, a user can define a plane that is a section of a three-dimensional trigger mask. Adaptability to the specific circumstances and user preferences can thus be further increased.

According to one aspect, the method may comprise, for example, triggering an action in the event that the processed signal does not violate the trigger mask. In some embodiments, a signal not violating the trigger mask is to be understood as the signal lying within the area (or volume) defined by the trigger mask.

In some embodiments, the method may further comprise tagging portions of the demodulated measurement signal corresponding to portions of the processed signal not violating the mask. Portions of the demodulated signal having desired characteristics (e.g. a low level of a specific type of distortion) can thus be highlighted for a user.

The present disclosure further provides a computer-readable medium comprising instructions which, when executed by an electronic circuit, cause the electronic circuit to carry out a method comprising the steps of: obtaining a demodulated measurement signal; deriving a processed signal from the demodulated measurement signal; applying a trigger mask to the processed signal; and evaluating if the processed signal creates a trigger event with respect to the trigger mask, e.g. violates the trigger mask.

In some embodiments, the electronic circuit is a processor circuit or computer circuit of a test instrument or of a computer.

In some embodiments, the instructions on the storage medium, when executed by the electronic circuit, may cause the electronic circuits to carry out any of the methods for analyzing a demodulated measurement signal described herein.

The present disclosure further provides a test instrument configured for: obtaining a demodulated measurement signal, deriving a processed signal from the demodulated measurement signal; applying a trigger mask to the processed signal; and evaluating if the processed signal creates a trigger event with respect to the trigger mask, e.g. violates the trigger mask.

The test instrument may be for example a signal and spectrum analyzer or a vector signal analyzer.

As indicated above, the trigger event may be created when a trigger condition defined by the trigger mask is met. This may relate to violating the trigger mask or falling into the trigger mask. In other words, a signal violating a trigger mask is to be understood as the signal having a value lying outside an area defined by the trigger mask, whereas a signal falling into the trigger mask is to be understood as the signal having a value lying inside an area defined by the trigger mask.

Both scenarios may create a trigger event, which depends on the type of trigger applied.

Moreover, the test instrument may be configured for carrying out any of the methods for analyzing a demodulated measurement signal described herein. Hence, the features and advantages described with regard to the method apply analogously to the test instrument.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
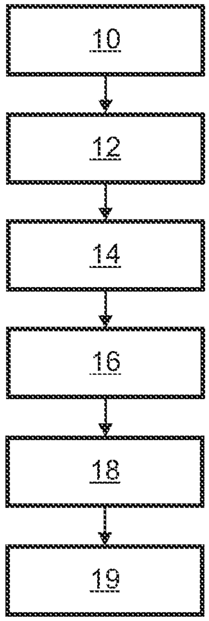
FIG. 1 is a flow chart illustrating a method for analyzing a demodulated measurement signal according to an embodiment of the present disclosure.

FIG. 1 is a flow chart illustrating a method for analyzing a demodulated measurement signal according to an embodiment of the present disclosure. I the embodiment shown, the method comprises the step 10 of obtaining a demodulated measurement signal. In some embodiments, the demodulated measurement signal is derived from a (digitally) modulated signal. In some embodiments, the (digitally) modulated signal is a single-carrier signal.

The method also comprises the step 12 of deriving a processed signal 24 from the demodulated measurement signal. According to one aspect, the processed signal 24 may be, for example, a phase error, an error of the instantaneous frequency, or a magnitude error of the demodulated measurement signal with respect to a reference signal, as a function of time. Hence, the demodulated measurement signal is processed such that the phase error, the error of the instantaneous frequency or the magnitude error of the demodulated measurement signal is obtained, which can be further processed for analyzing purposes.

In some embodiments, the method may further comprise an optional step 14 of determining a frequency response of an equalizer function by calculating an optimal error vector magnitude for the demodulated measurement signal with respect to a reference signal. The processed signal 24 may be for example a frequency response magnitude, a frequency response phase, or a frequency response group delay of the equalizer function.

The method also comprises the step 16 of applying a trigger mask 26 to the processed signal 24. In some embodiments, the trigger mask 26 is an at least two-dimensional mask. The trigger mask 26 may be customizable such that a user can adapt its settings appropriately.

In some embodiments, the mask may be a three-dimensional mask. The method may comprise using a section of the three-dimensional mask as a two-dimensional mask.

According to one aspect, the trigger mask 26 is applied, for example, to a diagram that illustrates the processed signal 24. In some embodiments, the diagram is a representation of the processed signal 24 that may be output by a display 46 of a test instrument 30, namely a graphical representation or a visualization of the data associated with the processed signal 24.

Figure 2:
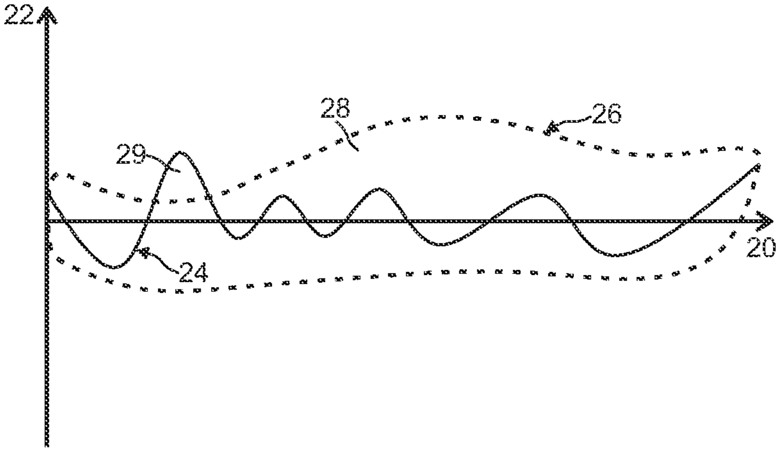
FIG. 2 is a diagram illustrating examples of a processed signal and a trigger mask according to aspects of the present disclosure.

An example diagram illustrating a processed signal 24 is shown in FIG. 2. The diagram may have at least a first axis 20 and a second axis 22. The trigger mask 26 defines an area 28 in the diagram. The trigger mask 26 may have a rectangular shape or an arbitrary shape as shown in FIG. 2. In some embodiments, the trigger mask 26 may be set by a user, e.g. when interacting with an input device, for instance a touch-sensitive display of a test instrument.

In the depicted example, the processed signal 24 violates the trigger mask 26 in a region 29. Hence, a trigger event may be created due to the violation.

Alternatively, the trigger mask 26 may relate to a specific area, which is usually not occupied by the signal, but a trigger event is created in case a signal value falls into the area defined by the trigger mask 26.

Consequently, a trigger event may be created when a trigger condition defined by the trigger mask 26 is met. As mentioned above, this may relate to violating the trigger mask 26 or falling into the trigger mask 26.

In some embodiments, the diagram may correspond to a phase error versus time or a frequency error versus time. As an example, a phase error as a function of symbols over time is shown in FIG. 2. In some embodiments, the frequency error is an error of the instantaneous frequency of the demodulated measurement signal with respect to a reference signal. In some embodiments, the first axis 20 has the unit symbols (sym) and the second axis 22 the unit degrees (°).

Figure 3:
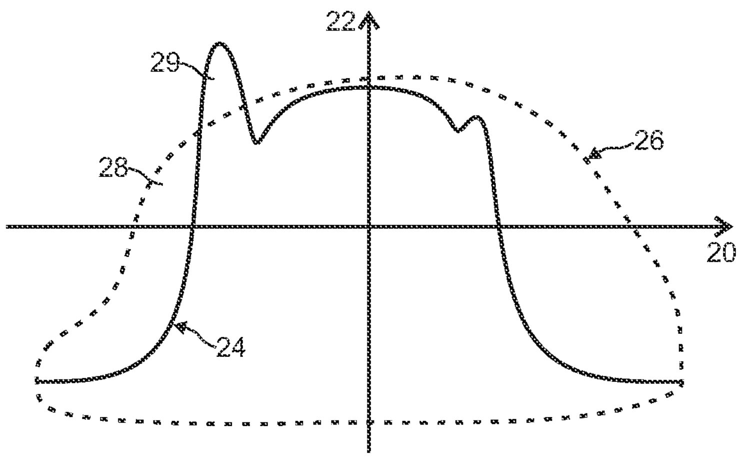
FIG. 3 is a diagram illustrating another examples of processed signal and a trigger mask according to aspects of the present disclosure.

The diagram may also correspond to a frequency response magnitude (FRM), as shown in FIG. 3. In some embodiments, the FRM is particularly a magnitude of a frequency response of the equalizer function. In some embodiments, the first axis 20 has the unit Hertz (Hz) and the second axis 22 the unit decibel (dB). In the example depicted in FIG. 3, the processed signal 24 creates a trigger event with respect to the trigger mask 26, e.g. violates the trigger mask 26 in a region 29 in the shown embodiment.

The method further comprises the step 18 of evaluating if the processed signal 24 violates the trigger mask 26. In the context of the present disclosure, a signal violating a trigger mask 26 is to be understood as the signal having a value lying outside the area 28 defined by the trigger mask 26. Again, as indicated above, the trigger event may also be created in case the signal has a value lying inside the area 28 defined by the trigger mask 26. Actually, it depends on the type of trigger applied whether a trigger event is caused by a signal value lying either inside or outside the area 28.

In some embodiments, the method may further comprise a step 19 of triggering an event if the processed signal 24 violates the trigger mask 26. In some embodiments, the method can include triggering a data acquisition when the processed signal violates the trigger mask 26.

The method may further comprise storing measurement data from a predefined time window encompassing a trigger event where the processed signal violates the trigger mask 26.

Moreover, the method may comprise tagging portions of the demodulated measurement signal corresponding to portions of the processed signal not violating the trigger mask 26.

Figure 4:
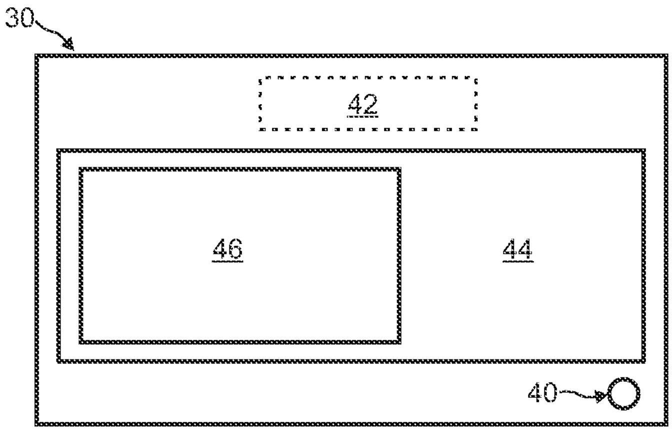
FIG. 4 schematically shows a test instrument according to an embodiment of the present disclosure.

FIG. 4 schematically shows a test instrument 30 according to embodiments of the present disclosure. The test instrument 30 may be for example a vector signal analyzer. As shown in FIG. 4, the test instrument 30 comprises a signal input connector 40, an electronic circuit 42, and a user interface 44. The user interface may include a display 46, for example a touchscreen display. The test instrument 30 may be configured for carrying out a method as described above with regard to FIGS. 1-3.

Embodiments of the present disclosure further provides a computer-readable storage medium comprising instructions which, when executed by an electronic circuit, e.g. the electronic circuit 42, cause the electronic circuit to carry out a method as described above with regard to FIGS. 1-3.

Certain embodiments disclosed herein include components that utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

In some examples, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implemented the functionality described herein.

Various embodiments of the present disclosure or the functionality thereof may be implemented in various ways, including as non-transitory computer program products. A computer program product may include a non-transitory computer-readable medium storing applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably). Such non-transitory computer-readable media include all computer-readable media (including volatile and non-volatile media).

Embodiments of the present disclosure may also take the form of an apparatus, system, computing device, computing entity, and/or the like executing instructions stored on computer-readable media to perform certain steps or operations. The computer-readable media include cooperating or interconnected computer-readable media, which exist exclusively on a processing or processor system or distributed among multiple interconnected processing or processor systems that may be local to, or remote from, the processing or processor system. However, embodiments of the present disclosure may also take the form of an entirely hardware embodiment performing certain steps or operations.

Various embodiments are described above with reference to block diagrams and/or flowchart illustrations of apparatuses, methods, systems, and/or computer program instructions or program products. It should be understood that each block of any of the block diagrams and/or flowchart illustrations, respectively, or portions thereof, may be implemented in part by computer program instructions, e.g., as logical steps or operations executing on one or more computing devices. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein.

These computer program instructions may also be stored in one or more computer-readable memory or portions thereof, such as the computer-readable media described above, that can direct one or more computers or computing devices or other programmable data processing apparatus(es) to function in a particular manner, such that the instructions stored in the computer-readable memory produce an article of manufacture including computer-readable instructions for implementing the functionality specified in the flowchart block or blocks.

The computer program instructions may also be loaded onto one or more computers or computing devices or other programmable data processing apparatus(es) to cause a series of operational steps to be performed on the one or more computers or computing devices or other programmable data processing apparatus(es) to produce a computer-implemented process such that the instructions that execute on the one or more computers or computing devices or other programmable data processing apparatus(es) provide operations for implementing the functions specified in the flowchart block or blocks and/or carry out the methods described herein.

It will be appreciated that the term computer or computing device can include, for example, any computing device or processing structure, including but not limited to a processor (e.g., a microprocessor), a central processing unit (CPU), a graphical processing unit (GPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In some embodiments, one or more of the components referenced above include circuitry programmed to carry out one or more steps of any of the methods disclosed herein. In some embodiments, one or more computer-readable media associated with or accessible by such circuitry contains computer readable instructions embodied thereon that, when executed by such circuitry, cause the component or circuitry to perform one or more steps of any of the methods disclosed herein.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term “plurality” to reference a quantity or number. In this regard, the term “plurality” is meant to be any number that is more than one, for example, two, three, four, five, etc. The terms “about,” “approximately,” “near,” etc., mean plus or minus 5% of the stated value. For the purposes of the present disclosure, the phrase “at least one of A and B” is equivalent to “A and/or B” or vice versa, namely “A” alone, “B” alone or “A and B.”. Similarly, the phrase “at least one of A, B, and C,” for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for analyzing a demodulated measurement signal in a test instrument, the method comprising:

obtaining a demodulated measurement signal from a modulated signal received at a signal input of the test instrument;

deriving a processed signal from the demodulated measurement signal, wherein the deriving comprises determining a frequency response of an equalizer function by calculating an error vector magnitude for the demodulated measurement signal with respect to a reference signal;

applying a trigger mask to the processed signal;

determining that the processed signal creates a trigger event with respect to the trigger mask; and responsive to determining that the processed signal creates the trigger event with respect to the trigger mask, triggering a data acquisition including transferring signal data from a data buffer to memory, wherein applying the trigger mask reduces a risk of missing distortion events in the processed signal.

2. The method according to claim 1, wherein the trigger mask is an at least two-dimensional mask that is applied to a diagram that illustrates the processed signal.

3. The method according to claim 2, wherein the trigger mask defines an area in the diagram.

4. The method according to claim 2, wherein the diagram corresponds to a phase error versus time or a frequency error versus time.

5. The method according to claim 1, wherein calculating the error vector magnitude comprises calculating an optimized error vector magnitude by minimizing a mean square error vector magnitude.

6. The method according to claim 1, wherein the processed signal is a frequency response magnitude of the equalizer function.

7. The method according to claim 1, wherein the processed signal is a frequency response phase or a frequency response group delay of the equalizer function.

8. The method according to claim 1, wherein the processed signal is a phase error of the demodulated measurement signal with respect to a reference signal, as a function of time.

9. The method according to claim 1, wherein the processed signal is an error of the instantaneous frequency of the demodulated measurement signal with respect to a reference signal.

10. The method according to claim 1, wherein the processed signal is a magnitude error of the demodulated measurement signal with respect to a reference signal, as a function of time.

11. The method according to claim 1, further comprising storing measurement data from a predefined time window encompassing the trigger event.

12. The method according to claim 1, wherein the trigger mask is customizable.

13. The method according to claim 1, wherein the trigger mask is a three-dimensional mask.

14. The method according to claim 13, further comprising using a section of the three-dimensional mask as a two-dimensional mask.

15. The method according to claim 1, further comprising tagging portions of the demodulated measurement signal corresponding to portions of the processed signal not violating the trigger mask.

16. A non-transitory computer-readable storage medium comprising instructions which, when executed by an electronic circuit of a test instrument, cause the electronic circuit to perform the steps of:

obtaining a demodulated measurement signal from a modulated signal received at a signal input of the test instrument;

deriving a processed signal from the demodulated measurement signal, wherein the deriving comprises determining a frequency response of an equalizer function by calculating an error vector magnitude for the demodulated measurement signal with respect to a reference signal;

applying a trigger mask to the processed signal;

determining that the processed signal creates a trigger event with respect to the trigger mask; and responsive to determining that the processed signal creates the trigger event with respect to the trigger mask, triggering a data acquisition including transferring signal data from a data buffer to memory, wherein applying the trigger mask reduces a risk of missing distortion events in the processed signal.

17. A test instrument comprising circuitry configured to:

obtain a demodulated measurement signal from a modulated signal received at a signal input of the test instrument, derive a processed signal from the demodulated measurement signal, wherein deriving the processed signal comprises determining a frequency response of an equalizer function by calculating an error vector magnitude for the demodulated measurement signal with respect to a reference signal;

apply a trigger mask to the processed signal;

determine that the processed signal creates a trigger event with respect to the trigger mask; and responsive to determining that the processed signal creates the trigger event with respect to the trigger mask, trigger a data acquisition including transferring signal data from a data buffer to memory, wherein applying the trigger mask reduces a risk of missing distortion events in the processed signal.

18. The test instrument according to claim 17, wherein the test instrument is a vector signal analyzer.

19. The test instrument according to claim 17, wherein the trigger mask is a two-dimensional or three-dimensional mask applied to a diagram of the processed signal displayed on a display of the test instrument, wherein the trigger mask defines an area of the diagram, and wherein the processed signal creates the trigger event with respect to the trigger mask when a phase error or frequency error of the demodulated measurement signal has a value outside or inside the area defined by the trigger mask.

* * * * *